United States Patent
Regnat et al.

(10) Patent No.: US 12,430,481 B2
(45) Date of Patent: Sep. 30, 2025

(54) METHOD, COMPUTER PROGRAM PRODUCT AND MODELING TOOL FOR CREATING A SYSTEM MODEL, WHICH REPRESENTS A TECHNICAL SYSTEM TO BE DEVELOPED, AS A DIGITAL SYSTEM TWIN

(71) Applicant: Siemens Aktiengesellschaft, Munich (DE)

(72) Inventors: Nikolaus Regnat, Munich (DE); Jan Winhuysen, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 1017 days.

(21) Appl. No.: 17/505,176

(22) Filed: Oct. 19, 2021

(65) Prior Publication Data
US 2022/0198099 A1 Jun. 23, 2022

(30) Foreign Application Priority Data
Dec. 21, 2020 (EP) .................................... 20216044

(51) Int. Cl.
*G06F 30/20* (2020.01)
*G06F 30/12* (2020.01)

(52) U.S. Cl.
CPC ............... *G06F 30/20* (2020.01); *G06F 30/12* (2020.01)

(58) Field of Classification Search
CPC ....... G06F 30/20; G06F 30/12; G06Q 10/101; G06Q 50/00
See application file for complete search history.

(56) References Cited

FOREIGN PATENT DOCUMENTS

DE 102015209715 A1 12/2016

OTHER PUBLICATIONS

Broy M, Feilkas M, Herrmannsdoerfer M, Merenda S, Ratiu D. Seamless model-based development: From isolated tools to integrated model engineering environments. Proceedings of the IEEE. Feb. 25, 2010;98(4):526-45. (Year: 2010).*

(Continued)

*Primary Examiner* — Chuen-Meei Gan
(74) *Attorney, Agent, or Firm* — Schmeiser, Olsen & Watts, LLP

(57) ABSTRACT

In order to create a system model, it is proposed that 1) in the course of the development of the technical system at least one partial architecture of the system should convert a textual system architecture description into a model-based system architecture description, 2) a computer-aided conversion orchestration, wherein a user-based data and command input and a logic-based data processing and command implementation are used to orchestrate the conversion in accordance with a stipulation based on a set of rules, should, in a first orchestration phase, use the system model, as conversion target model, to ascertain for a system development tool conversion rules for identifying partial aspects of a system architecture of the technical system to be developed, in a second orchestration phase, implement the conversion of the textual system architecture description into the model-based system architecture description iteratively for a partial-aspect-based description of the system architecture.

3 Claims, 4 Drawing Sheets

(56) References Cited

OTHER PUBLICATIONS

Aravantinos V, Miyamoto K, Molotnikov Z, Regnat N, Schätz B. Textual model-based software/system architecture documentation using MPS. InSoftware-engineering and management 2015 2015 (pp. 232-237). Gesellschaft für Informatik eV. (Year: 2015).*

Yun S, Park JH, Kim WT. Data-centric middleware based digital twin platform for dependable cyber-physical systems. In2017 ninth international conference on ubiquitous and future networks (ICUFN) Jul. 4, 2017 (pp. 922-926). IEEE. (Year: 2017).*

Yun, Seongjin et al: "Data-centric middleware based digital twin platform for dependable cyber-physical systems"; 2017 Ninth International Conference on Ubiquitous and Future Networks (ICUFN); IEEE; Jul. 4, 2017; pp. 922-926; XP033130469; DOI: 10.1109/ICUFN.2017.7993933; 2017.

Wright, Louise et al: "How to tell the difference between a model and a digital twin"; Advanced Modeling and Simulation in Engineering Sciences; Biomed Central Ltd; London, UK; vol. 7; No. 1; Mar. 11, 2020; pp. 1-13; XP021273689; DOI: 10.1186/S40323-020-00147-4; 2020.

Broy, Manfred et al: "Seamless Model-Based Development: From Isolated Tools to Integrated Model Engineering Environments"; Proceedings of the IEEE; IEEE; New York; vol. 98; No. 4; 526-545; XP011350419; ISSN: 0018-9219; DOI: 10.1109/JPROC.2009.2037771; 2010.

Rahm, Julian et al: "A proposal for an interactive roundtrip engineering system"; 2017 22nd IEEE International Conference on Emerging Technologies and Factory Automation (ETFA); IEEE; Sep. 12, 2017; pp. 1-7; XP033292910; DOI: 10.1109/ETFA.2017.8247576; 2017.

Bosch Iot Suite: "Digital Twin"; Aug. 6, 2020; pp. 1-7; XP055807552; URL: https://web.archive.org/web/20200806181408/https://docs.bosch-iotsuite.com/things/getting-started/twin/ [retrieved on May 26, 2021]; 2020.

Mendes, Marco J. et al: "Composition of Petri nets models in service-oriented industrial automation"; Industrial Informatics (INDIN); 2010 8th IEEE International Conference on; IEEE; Piscataway, NJ; USA; Jul. 13, 2010; pp. 578-583; XP031733672; ISBN: 978-1-4244-7298-7; 2010.

Dassault Systèmes: "Abaqus 6.14—Abaqus/CAE User's Guide"; Jan. 1, 2014; pp. 1-1146; XP055807547; URL: http://130.149.89.49:2080/v6.14/pdf_books/CAE.pdf [retrieved on May 26, 2021]; 2014.

European Search Report for Application No. 20216044.6, dated Jun. 14, 2021.

* cited by examiner

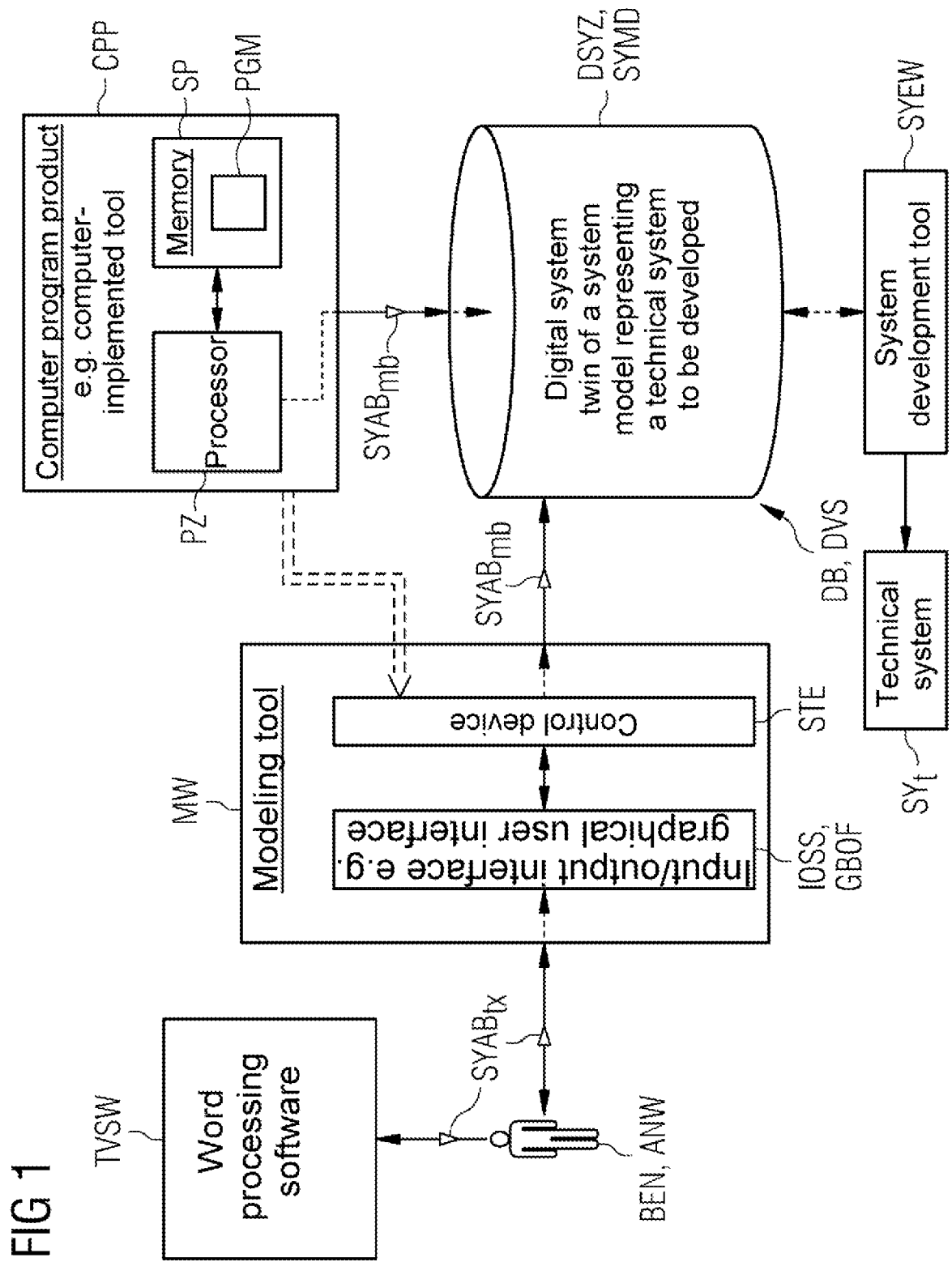

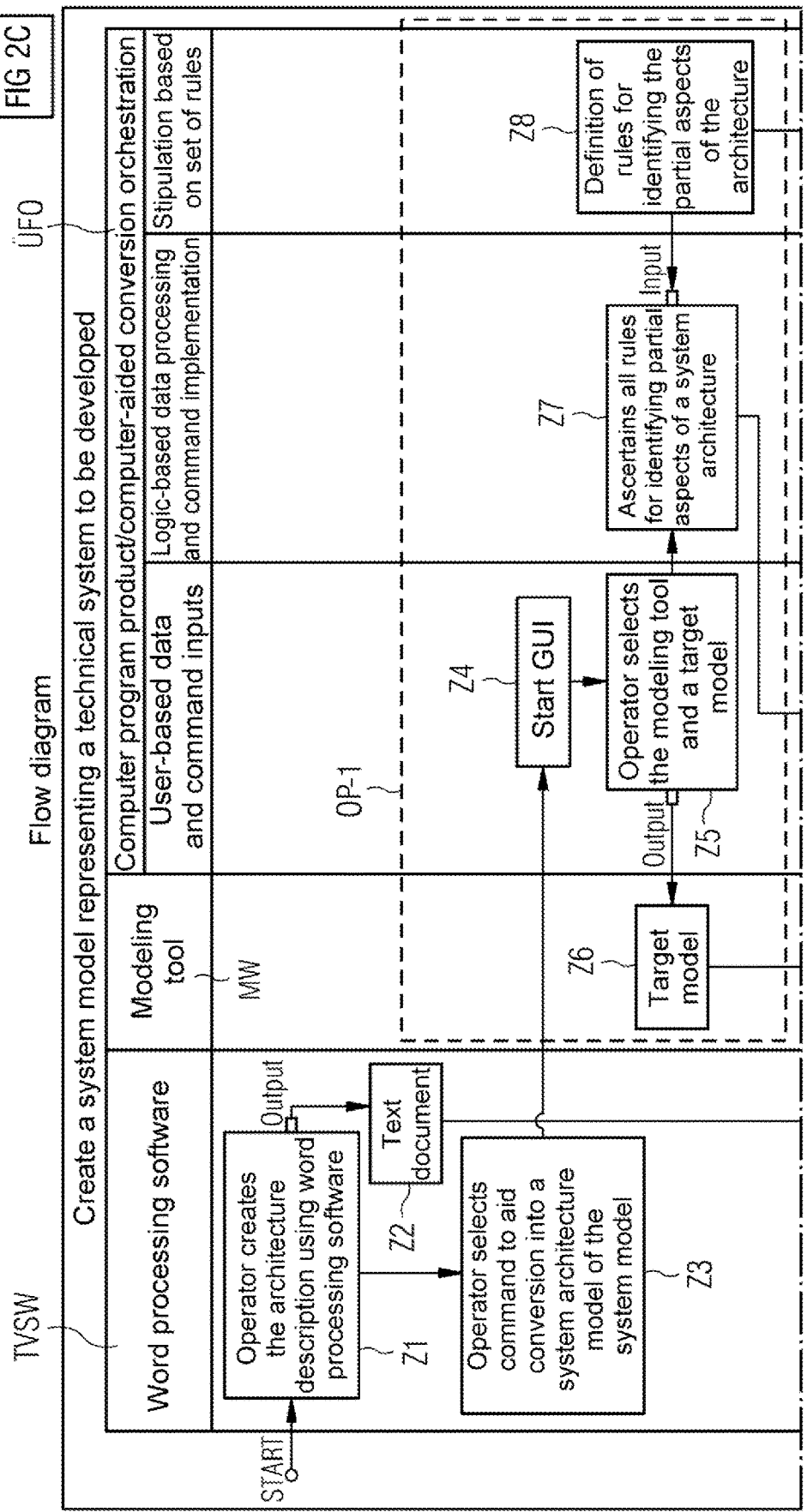

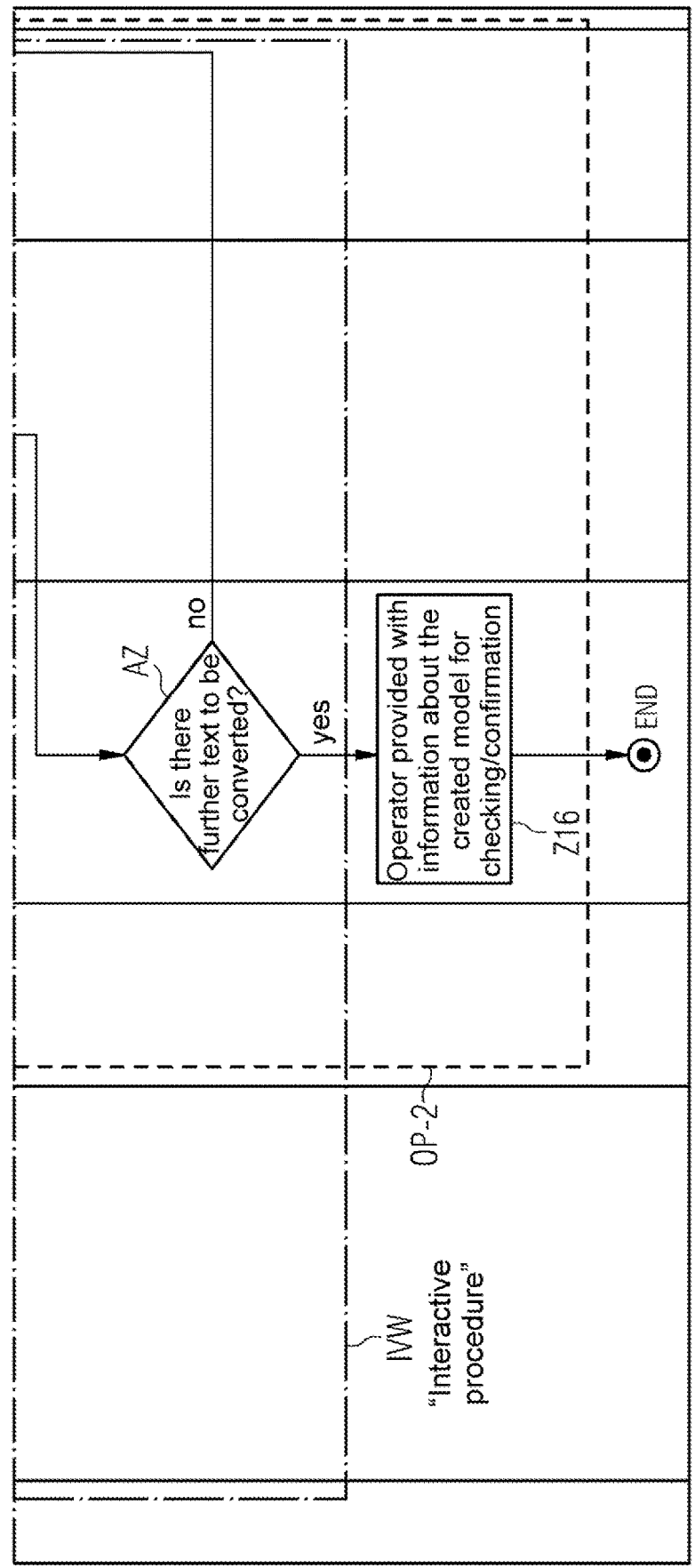

METHOD, COMPUTER PROGRAM PRODUCT AND MODELING TOOL FOR CREATING A SYSTEM MODEL, WHICH REPRESENTS A TECHNICAL SYSTEM TO BE DEVELOPED, AS A DIGITAL SYSTEM TWIN

CROSS-REFERENCE TO RELATED APPLICATIONS

This application claims priority to EP Application No. 20216044.6, having a filing date of Dec. 21, 2020, the entire contents of which are hereby incorporated by reference.

FIELD OF TECHNOLOGY

The following relates to a method for creating a system model, which represents a technical system to be developed, as a digital system twin, a computer program product for creating a system model, which represents a technical system to be developed, as a digital system twin, and a modeling tool for creating a system model, which represents a technical system to be developed, as a digital system twin.

BACKGROUND

When developing complex systems from complex systems in different technical domains, referred to as a technical system below, it is customary to use graphical modeling tools, e.g., in order to describe system models for architectures consistently. The further development work on the technical system requires model information to be linearized and complemented by further descriptions. However, this linearization requires measures that allow sophisticated development and maintenance and ensure that the quality called for by (human) users is achieved.

The cited technical domains may be any. As such, examples of these are (not an exhaustive list): automation engineering, power engineering, communications engineering, medical engineering, vehicle engineering relating to road, rail, water or air vehicles.

Based on the present conventional art, graphical modeling tools are used, e.g., in order to describe architectures by using models. Next, an easily readable document can then be generated from these models by using document generators. The development and maintenance of these document generators is very sophisticated, however, and additionally requires continual maintenance.

Another widely used approach involves creating documents manually and enhancing them with images or graphics as required. However, this often results in very inconsistent documents that do not meet the requisite quality demands of customary process specifications.

SUMMARY

An aspect relates to specifying a method, a computer program product (non-transitory computer readable storage medium having instructions, which when executed by a processor, perform actions) and a modeling tool for creating a system model, which represents a technical system to be developed, as a digital system twin, wherein textual system architecture descriptions are converted into model-based system architecture descriptions in an automated manner.

The concept on which embodiments of the invention is based is that a) in the course of the development of the technical system at least one partial architecture of the system converts a textual system architecture description into a model-based system architecture description and thus either initially generates or extends the system model, b) a computer-aided conversion orchestration, wherein a user-based data and command input and a logic-based data processing and command implementation are used to orchestrate the conversion in accordance with a stipulation based on a set of rules, b1) in a first orchestration phase for converting the textual system architecture description, uses the system model, as conversion target model, to ascertain for a system development tool conversion rules for identifying partial aspects of a system architecture of the technical system to be developed, b2) in a second orchestration phase, implements the conversion of the textual system architecture description into the model-based system architecture description iteratively for a partial-aspect-based description of the system architecture while observing the ascertained conversion rules.

In contrast to the known solutions, the approach proposed above allows a generic implementation to be developed that avoids sophisticated adaptation and continual maintenance. In addition, the user or operator using or implementing the proposed approach can, when developing the technical system by creating the system model, which represents the system, as a digital system twin, concentrate on essential aspects for the system development, namely the creation of the text-based or human-readable document that contains the textual system architecture description, while the consistent system model is created or constructed using the model-based system architecture description in the background.

Moreover, the model-based documents or system architecture descriptions created using the proposed approach have much higher consistency, and hence quality, than manually created documents or system architecture descriptions.

BRIEF DESCRIPTION

Some of the embodiments will be described in detail, with reference to the following figures, wherein like designations denote like members, wherein:

FIG. 1 shows a scenario for the creation of a system model, which represents a technical system to be developed, as a digital system twin, FIG. 2 shows how FIGS. 2A, 2B and 2C are split into three parts;

FIG. 2A shows a first part of a flow diagram for the creation of the system model, which represents the technical system to be developed, as the digital system twin according to the scenario depicted in FIG. 1;

Figure 2B:
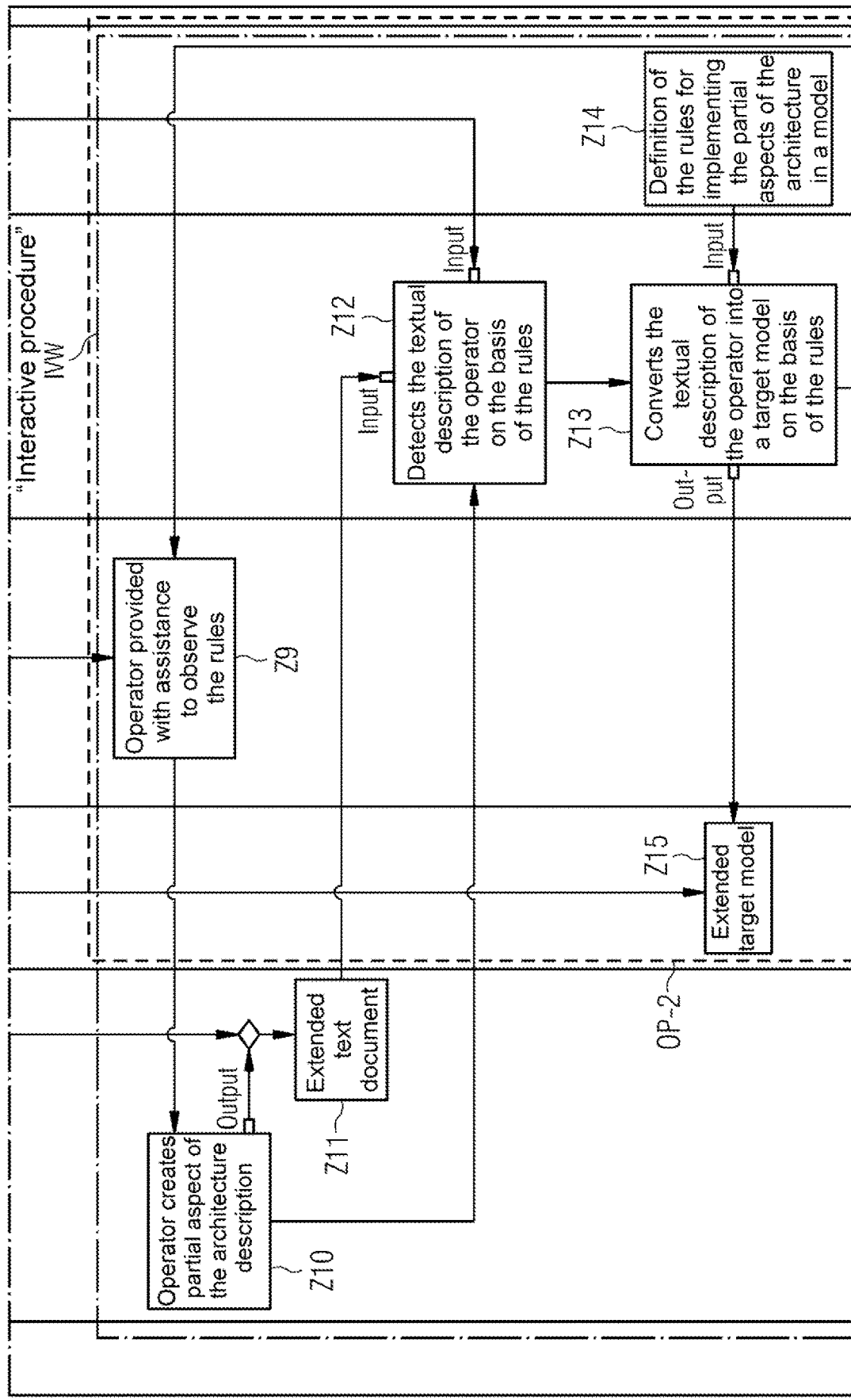

FIG. 2B shows a second part of a flow diagram for the creation of the system model, which represents the technical system to be developed, as the digital system twin according to the scenario depicted in FIG. 1; and FIG. 2C shows a third part of a flow diagram for the creation of the system model, which represents the technical system to be developed, as the digital system twin according to the scenario depicted in FIG. 1.

DETAILED DESCRIPTION

FIG. 1 shows a scenario for the creation of a system model SYMD, which represents a technical system $SY_t$ to be developed, as a digital system twin DSYZ. For this system development there is provision, according to the depicted scenario, for a system development tool SYEW that, for this purpose, accesses a database DB or a data processing system DVS having the system model SYMD stored therein as the digital system twin DSYZ. These access operations on the database DB or the data processing system DVS are used to download model information of the system model SYMD for the system development.

The technical system $SY_t$ and the system development tool SYEW are subjects of a "physical world" in which the technical system $SY_t$ may, according to the definition indicated at the outset for technical domains, be e.g. a CT scanner or an MRI scanner in the field of medical engineering or a wind turbine in the field of power engineering or a passenger vehicle (car) in the field of vehicle engineering and the system development tool SYEW is in the form of a workstation computer (workstation) or personal computer.

Another subject of the "physical world" according to the depicted scenario is a modeling tool MW for creating the digital system twin DSYZ, which is also again in the form of a workstation computer (workstation) or personal computer.

Both the system development tool SYEW and the modeling tool MW are the link to a "digital world" in as much as the two access the digital system twin DSYZ, the system development tool SYEW in order to download the model information of the system model SYMD for the system development and the modeling tool MW in order to create the digital system twin DSYZ or the system model SYMD.

In order to be able to create this digital system twin DSYZ or the system model SYMD for developing the technical system $SY_t$ by means of at least one partial architecture of the system $SY_t$, the modeling tool MW has a control device STE and an input/output interface IOSS for user inputs and outputs of a user BEN or operator ANW of the modeling tool MW, which input/output interface is connected to the control device STE and is in the form of a graphical user interface GBOF.

The control device STE is connected to the database DB or the data processing system DVS for the purpose of developing the technical system $SY_t$ and accessing the digital twin DZ.

The creation of the digital system twin DSYZ or the system model SYMD is carried out neither by the modeling tool MW nor by the control device STE as such, however, but rather relaying is the subject of a further digital block in the "digital world". This digital block is a computer program product CPP for creating the digital system twin DSYZ and, in the course thereof, for developing the technical system $SY_t$, which is in the form of a computer-implemented tool and is a piece of application software—also referred to as an "APP".

Furthermore, the computer program product CPP has a nonvolatile, readable memory SP, which stores processor-readable control program commands of a program module PGM for creating the digital system twin DSYZ or the system model SYMD, and a processor PZ, connected to the memory SP, that has the control program commands of the program module PGM for system model creation.

This computer program product CPP, which is in the form of a computer-implemented tool, or the "APP" can be loaded into the control device STE for the purpose of reference-model-based requirement-related development of the technical system $SY_t$ [represented in FIG. 1 by the dashed double arrow (arrow with dual base)] and can be developed and sold independently of the modeling tool MW.

In the course of the development of the at least one partial architecture of the system $SY_t$, the user BEN or operator ANW of the modeling tool MW inputs a textual system architecture description $SYAB_{tx}$ from a piece of word processing software TVSW into the input/output interface IOSS in the form of the graphical user interface GBOF.

The way in which the creation of the digital system twin DSYZ or of the system model SYMD as part of the at least one partial architecture of the system $SY_t$ works according to the depicted scenario, wherein the textual system architecture description $SYAB_{tx}$ is converted into a model-based system architecture description $SYAB_{mb}$ and hence the system model SYMD is either initially generated or extended, and also proceeds and is carried out in the modeling tool MW and in the computer program product CPP will now be illustrated in connection with FIG. 2.

FIGS. 2A, 2B and 2C show a flow diagram for the creation of the system model SYMD, which represents the technical system $SY_t$ to be developed, as the digital system twin DSYZ according to the scenario depicted in FIG. 1. According to this flow diagram, the creation of the system model SYMD or of the digital system twin DSYZ for developing the technical system $SY_t$ is essentially characterized by a conversion orchestration ÜFO, wherein, according to the scenario, aided by the computer program product CPP or in a computer-aided manner, the conversion of the textual system architecture description $SYAB_{tx}$ into the model-based system architecture description $SYAB_{mb}$ and hence the initial generation or the extension of the system model SYMD or of the digital system twin DSYZ is orchestrated.

Based on the flow diagram depicted in FIGS. 2A, 2B and 2C, the conversion orchestration ÜFO, according to which every conversion is orchestrated with a user-based data and command input and a logic-based data processing and command implementation in accordance with a stipulation based on a set of rules, is divided into two orchestration phases, a first orchestration phase OP-1 and a second orchestration phase OP-2.

Here, in accordance with a stipulation based on a set of rules means that rules critically define which information, e.g. aspects of a system architecture, is relevant to the creation of the system model. A rule defines which information, e.g. partial aspect of a description of the system or of the system architecture, is supposed to be converted and in what way.

The rules specifically determine:
How the respective information can be identified.
How the respective information is supposed to be transformed into the system model.

Example: the textual description describes interfaces of the technical system using a table containing defined columns (name of the interface, description of the interface, physical connector of the interface, etc.). The tables themselves are marked by the heading "Interfaces of a component of the model". A rule now describes this kind of tables for interfaces and also describes how the transformation into the model is supposed to take place. As such, the model could contain an "interface" element, which likewise has properties such as "name" or "description". However, other properties such as "physical connector" require a more sophisticated transformation, for example, since the model contains e.g. separate elements for physical connectors and these then need to be referenced.

According to the flow diagram, system model creation begins with, in a first state Z1, the operator ANW or user BEN shown in FIG. 1 using the word processing software TVSW to create the textual system architecture description $SYAB_{tx}$. Next, in a second state Z2, the operator ANW or user BEN generates a corresponding text document and in a third state Z3 the operator ANW or user BEN selects a command to aid conversion into a system architecture model of the system model.

This is the transition from the word processing software TVSW via the modeling tool MW, where the textual system architecture description $SYAB_{tx}$ embedded in the text document is input (cf. FIG. 1), to the first orchestration phase OP-1 of the conversion orchestration ÜFO, which is aided by the computer program product CPP or computer-aided. It initially involves starting the graphical user interface GBOF (<GUI>) in a fourth state Z4 in the course of the user-based data and command input during the conversion orchestration ÜFO.

The created system architecture description $SYAB_{tx}$ and the text document (cf. states Z1 and Z2) and the command selection (cf. state Z3) are taken as a basis in the first orchestration phase OP-1, which involves using the system model SYMD, as conversion target model, to ascertain for the system development tool SYEW conversion rules for identifying partial aspects of a system architecture of the technical system $SY_t$ to be developed, for selecting the modeling tool MW and a possible target model for the conversion in a fifth state Z5 in the course of the user-based data and command input during the conversion orchestration ÜFO.

Target model relates purely to the storage location in the database DB or in the data processing system DVS at which the textual system architecture description $SYAB_{tx}$ is supposed to be converted using the model-based system architecture description $SYAB_{mb}$. This can thus be e.g. the database DB.

From the fifth state Z5, the selected target model is transferred to the modeling tool MW in a sixth state Z6 in the course of the user-based data and command input during the conversion orchestration ÜFO.

In addition, all rules (conversion rules) for identifying the partial aspects of the system architecture are ascertained in a seventh state Z7 in the course of the logic-based data processing and command implementation during the conversion orchestration ÜFO.

This ascertainment of the rules for identifying the partial aspects of the system architecture involves defining the rules for identifying the partial aspects of the system architecture in an eighth state Z8 as part of the rule-based stipulation during the conversion orchestration ÜFO.

On ascertainment of the rules for identifying the partial aspects of the system architecture in the seventh state Z7 in the course of the logic-based data processing and command implementation during the conversion orchestration ÜFO, the conversion orchestration ÜFO involves the transition from the first orchestration phase OP-1 to the second orchestration phase OP-2 taking place.

The second orchestration phase OP-2 during the access orchestration ZGO involves the conversion of the textual system architecture description $SYAB_{tx}$ into the model-based system architecture description $SYAB_{mb}$ being implemented in the course of an iterative procedure IVW, that is to say iteratively, for a partial-aspect-based description of the system architecture while observing the ascertained conversion rules.

This iterative procedure IVW in the second orchestration phase OP-2 and depicted as an iteration loop between states Z9 and Z15 of the flow diagram in FIGS. 2A, 2B and 2C starts with the operator being provided with assistance to observe the ascertained rules, the conversion rules, in a ninth state Z9 in the course of the user-based data and command input during the conversion orchestration ÜFO.

As such, in a first state Z10 the operator ANW uses the word processing software TVSW to create a partial aspect of the description of the system architecture, whereupon the operator ANW or user BEN then extends the text document produced in the second state Z2 in an eleventh state Z11.

The extended text document (cf. state Z11) and the command selection (cf. state Z3) are again taken as a basis for capturing the textual description of the operator on the basis of the rules (conversion rules) in a twelfth state Z12 in the course of the logic-based data processing and command implementation during the conversion orchestration ÜFO.

After that, the captured, textual description of the user is likewise converted into the target model on the basis of the rules in a thirteenth state Z13 in the course of the logic-based data processing and command implementation during the conversion orchestration ÜFO.

This conversion of the textual description involves defining the rules for implementing the partial aspects of the system architecture in a model (the system model) in a fourteenth state Z14 as part of the rule-based stipulation during the conversion orchestration ÜFO. Additionally, proceeding from the thirteenth state Z13 in the course of the logic-based data processing and command implementation during the conversion orchestration ÜFO, the target model that has been transferred to the modeling tool MW in the sixth state Z6 is extended in a fifteenth state Z15 in accordance with the conversion of the textual description.

If the textual description has been converted into the target model (cf. state Z13), then a test state AZ in the course of the user-based data and command input during the conversion orchestration ÜFO tests whether there is further text to be converted. If the result of the test is "YES" then information about the created model, the system model, is made available to the operator ANW or user BEN in a sixteenth state Z16 in the course of the user-based data and command input during the conversion orchestration ÜFO for the purpose of checking (confirmation), wherein receipt of the information and the performed check are followed by the conversion orchestration ÜFO and the second orchestration phase OP-2 being finished and the end of the flow diagram being reached, whereas if the test result is "NO" then the iteration loop of the flow diagram as defined by the iterative procedure IVW continuously returns to the ninth state Z9 in the course of the user-based data and command input during the conversion orchestration ÜFO.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for creating a system model, which represents a technical system to be developed, as a digital system twin, wherein in the course of the development of the technical system at least one partial architecture of the technical system converts a textual system architecture description into a model-based system architecture description and thus either initially generates or extends the system model, the method comprising:

a) a computer-aided conversion orchestration, wherein a user-based data and command input from a user and a logic-based data processing and command implementation are used to orchestrate the conversion in accordance with a stipulation based on a set of rules, by means of which a1) in a first orchestration phase for converting the textual system architecture description, the system model is used, as conversion target model, by a computer program product having at least one processor to ascertain for a system development tool conversion rules for identifying partial aspects of a system architecture of the technical system to be developed, and a2) in a second orchestration phase, assistance is provided to the user, and the conversion of the textual system architecture description into the model-based system architecture description is implemented iteratively by the computer program product having the at least one processor for a partial-aspect-based description of the system architecture while observing the ascertained conversion rules; wherein the iterative procedure is ended upon receipt of user confirmation.

2. A computer program product for creating a system model, which represents a technical system to be developed, as a digital system twin, comprising a non-transitory, readable memory, which stores processor-readable control program commands of a program module for creating the system model, and a processor, connected to the memory, that executes the control program commands of the program module for system model creation, wherein, to that end, in the course of the development of the technical system at least one partial architecture of the technical system converts a textual system architecture description into a model-based system architecture description and thus either initially generates or extends the system model, wherein the processor and the program module for creating the system model are configured such that a) in the course of a conversion orchestration, wherein a user-based data and command input from a user and a logic-based data processing and command implementation are used to orchestrate the conversion in accordance with a stipulation based on a set of rules, a1) in a first orchestration phase for converting the textual system architecture description, the system model is used, as conversion target model, to ascertain for a system development tool conversion rules for identifying partial aspects of a system architecture of the technical system to be developed, a2) in a second orchestration phase, assistance is provided to the user, and the conversion of the textual system architecture description into the model-based system architecture description is implemented iteratively for a partial-aspect-based description of the system architecture while observing the ascertained conversion rules; wherein the iterative procedure is ended upon receipt of user confirmation.

3. A modeling tool for creating a system model, which represents a technical system to be developed, as a digital system twin, wherein in the course of the development of the technical system at least one partial architecture of the technical system converts a textual system architecture description into a model-based system architecture description and thus either initially generates or extends the system model, having a control device and an input/output interface, connected to the control device, for user inputs and outputs, the control device being connected to a database for storing the digital twin for the system model creation, wherein a computer program product loaded into the control device, the computer program product configured such that a) in the course of a conversion orchestration, wherein a user-based data and command input from a user and a logic-based data processing and command implementation are used to orchestrate the conversion in accordance with a stipulation based on a set of rules, a1) in a first orchestration phase for converting the textual system architecture description, the system model is used, as conversion target model, to ascertain for a system development tool conversion rules for identifying partial aspects of a system architecture of the technical system to be developed, a2) in a second orchestration phase, assistance is provided to the user, and the conversion of the textual system architecture description into the model-based system architecture description is implemented iteratively for a partial-aspect-based description of the system architecture while observing the ascertained conversion rules; wherein the iterative procedure is ended upon receipt of user confirmation.

* * * * *